United States Patent
Ko et al.

(10) Patent No.: US 7,466,008 B2
(45) Date of Patent: Dec. 16, 2008

(54) BICMOS PERFORMANCE ENHANCEMENT BY MECHANICAL UNIAXIAL STRAIN AND METHODS OF MANUFACTURE

(75) Inventors: Chih-Hsin Ko, Fongshan (TW); Tzu-Juei Wang, Hsinchu (TW); Hung-Wei Chen, Hsinchu (TW); Chung-Hu Ke, Taipei (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 11/717,484

(22) Filed: Mar. 13, 2007

(65) Prior Publication Data

US 2008/0224227 A1      Sep. 18, 2008

(51) Int. Cl.
    *H01L 27/06*     (2006.01)
    *H01L 27/07*     (2006.01)
(52) U.S. Cl. .............. 257/526; 257/565; 257/370; 257/632
(58) Field of Classification Search ........... 257/526, 257/565, 370, 632, E27.015, E27.03
    See application file for complete search history.

(56) References Cited

U.S. PATENT DOCUMENTS

| | | | | |
|---|---|---|---|---|
| 5,241,214 | A * | 8/1993 | Herbots et al. ............... | 257/649 |
| 6,509,587 | B2 * | 1/2003 | Sugiyama et al. ........... | 257/192 |
| 6,828,211 | B2 | 12/2004 | Chi | |
| 7,081,395 | B2 * | 7/2006 | Chi et al. .................... | 438/424 |
| 2004/0232513 | A1 | 11/2004 | Chi et al. | |
| 2007/0181977 | A1 * | 8/2007 | Lochtefeld et al. .......... | 257/618 |
| 2007/0252230 | A1 * | 11/2007 | Zhu et al. ................... | 257/499 |
| 2007/0267723 | A1 * | 11/2007 | Bernstein et al. ............ | 257/621 |

OTHER PUBLICATIONS

Creemer, J. F., et al., "A new model of the effect of mechanical stress on the saturation current of bipolar transistors," Sensors and Actuators A 97-98, Elsevier Science, 2002, pp. 289-295.
Gallon, C., et al., "Electrical Analysis of External Mechanical Stress Effects in Short Channel MOSFETs on (001) Silicon," Solid-State Electronics 48, Elsevier Science, vol. 48, 2004, pp. 561-566.
Thompson, S. E., et al., "A 90-nm Logic Technology Featuring Strained-Silicon," IEEE Transactions On Electron Devices, vol. 51, No. 11, Nov. 2004, pp. 1790-1797.
Thompson, S. E., et al., "Key Differences For Process-induced Uniaxial vs. Substrate-induced Biaxial Stressed Si and Ge Channel MOSFETs," IEEE, Dec. 2004, pp. 221-224.
Yuan, F., et al., "Mechanically Strained Si-SiGe HBTs," IEEE Electron Device Letters, vol. 25, No. 7, Jul. 2004, pp. 483-485.
Yang, H. S., et al., "Dual Stress Liner for High Performance sub-45nm Gate Length SOI CMOS Manufacturing," IEEE, Dec. 2004, pp. 1075-1077.

* cited by examiner

*Primary Examiner*—Victor A Mandala
(74) *Attorney, Agent, or Firm*—Slater & Matsil, L.L.P.

(57) ABSTRACT

A BiCMOS device with enhanced performance by mechanical uniaxial strain is provided. A first embodiment of the present invention includes an NMOS transistor, a PMOS transistor, and a bipolar transistor formed on different areas of the substrate. A first contact etch stop layer with tensile stress is formed over the NMOS transistor, and a second contact etch stop layer with compressive stress is formed over the PMOS transistor and the bipolar transistor, allowing for an enhancement of each device. Another embodiment has, in addition to the stressed contact etch stop layers, strained channel regions in the PMOS transistor and the NMOS transistor, and a strained base in the BJT.

20 Claims, 7 Drawing Sheets

BICMOS PERFORMANCE ENHANCEMENT BY MECHANICAL UNIAXIAL STRAIN AND METHODS OF MANUFACTURE

TECHNICAL FIELD

The present invention relates generally to semiconductor devices, and more specifically to BiCMOS devices, and even more specifically to BiCMOS devices having multiple regions with different stresses.

BACKGROUND

Bipolar Complementary Metal Oxide Semiconductors (BiCMOS) devices are semiconductor devices that combine bipolar and Complementary Metal Oxide Semiconductors (CMOS) on the same chip. Increasing the performance of these BiCMOS devices has been a constant effort so as to maximize the efficiency and reduce the size of the BiCMOS device.

Various methods have been used to increase the performance of BiCMOS devices. One such method involves forming a BiCMOS device with shallow trenches filled with a dielectric layer that has a lower thermal expansion coefficient than that of silicon. This inevitably results in a biaxial compressive strain, which causes a uniaxial tensile strain in the direction of collector current. However, while this biaxial compressive strain has been reported to enhance Bipolar Junction Transistors (BJTs) and Heterojunction Bipolar Transistors (HBTs), the biaxial compressive strain actually has a detrimental effect on the performance of other CMOSs on the same chip, especially for an NMOS transistor.

Another method that has been used to increase the performance of BiCMOS devices has been to use tensile or compressive stress films as contact etch stop layers (CESLs) over the devices. A compressive stress CESL, when formed over a PMOS transistor, can increase the performance of the PMOS transistor by acting to strain the channel region. However, the same compressive CESL, if formed over either an NMOS transistor or a BJT, will actually work to degrade the performance of the NMOS or BJT.

Conversely, a tensile CESL, when formed over either an NMOS transistor or a BJT, can increase the performance of the NMOS transistor or BJT by acting to strain the channel region of the devices. Unfortunately, this tensile CESL will have the opposite effect upon a PMOS transistor on the same chip, and will degrade the performance of the PMOS transistor. A single CESL placed on a chip cannot simultaneously enhance a PMOS transistor, an NMOS transistor, and a BJT.

Because of these and other problems associated with the current methods of forming BiCMOS devices, a new BiCMOS device that improves the performance of all of the devices on the chip is needed.

SUMMARY OF THE INVENTION

These and other problems are generally solved or circumvented, and technical advantages are generally achieved, by preferred embodiments of the present invention that allow for a BiCMOS device with enhanced performance by mechanical uniaxial strain One aspect of the present invention includes a semiconductor device with a substrate having three regions. A first semiconductor device is located in the first region, a second semiconductor device is located in the second region, and a third semiconductor device is located in the third region. A first dielectric film with a compressive strain is located over the first semiconductor device, and a second dielectric film with a tensile strain is located over the second and third semiconductor devices.

Another aspect of the present invention also includes a substrate with a first, second, and third region. An NMOS transistor is located in the first region, a PMOS transistor is located in the second region, and a BJT is located in the third region. A first dielectric film with a tensile strain is located over the NMOS transistor, and a second dielectric film with a compressive strain is located over the PMOS transistor and the BJT.

Yet another aspect of the present invention includes a BiCMOS device that initially comprises a substrate having three regions. An NMOS transistor is located in the first region, and the NMOS transistor has a strained channel region due to a lattice-mismatched material. A PMOS transistor is located in the second region, and the PMOS transistor also has a strained channel region due to a second lattice-mismatched material. A BJT is located in the third region, and the BJT has a lattice-mismatched base, to also form a strained channel region. A first dielectric film with a tensile strain is located over the NMOS transistor, and a second dielectric film with a compressive strain is located over the PMOS transistor and the BJT.

These aspects of the present invention allow for each device to be separately enhanced by the dielectric films. This allows for an enhancement of each device without the usual degradation of performance of the other devices on the same chip.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to steps in manufacturing the preferred embodiments in a specific context, namely a BiCMOS with a PMOS transistor, an NMOS transistor, and a BJT, where a tensile CESL is located on the NMOS transistor and a compressive CESL is located on the PMOS transistor and the BJT. The invention may also be applied in the making of other semiconductor devices.

Figure 1:
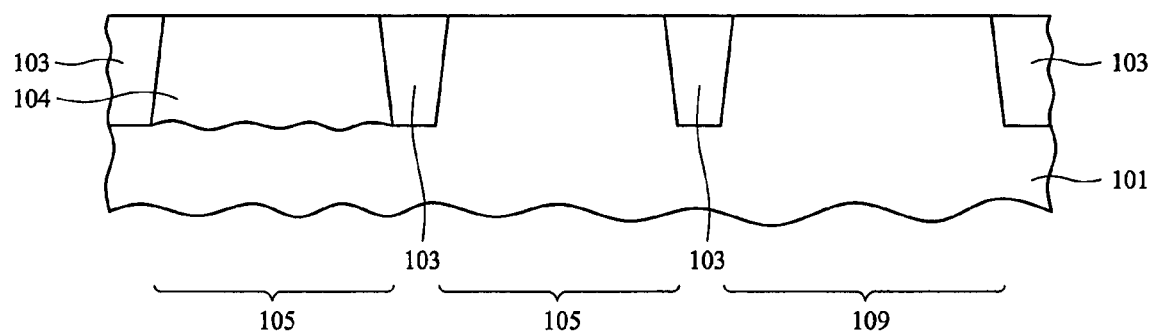
FIG. 1 is a cross-sectional view of a substrate with three regions separated by isolation structures in accordance with an embodiment of the present invention.

FIG. 1 illustrates a substrate 101 with isolations regions 103 formed therein. The substrate 101 may comprise bulk silicon, doped or undoped, or an active layer of a silicon on insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The substrate 101 is separated into a first region 105, a second region 107, and a third region 109 by isolation structures 103 in accordance with an embodiment of the present invention. The isolation regions 103 are generally shallow trench isolation structures (STIs) formed by etching the substrate 101 to form a trench and filling the trench with a dielectric material as is known in the art. Preferably, the isolation regions 103 are filled with a dielectric material such as an oxide material, a high-density plasma (HDP) oxide, or the like, formed by conventional methods known in the art. However, other types of isolation structures could alternatively be used to isolate the first region 105, the second region 107, and the third region 109 of the substrate 101.

In an embodiment where the substrate 101 is a p-type substrate, an n-well region 104 is formed in the second region 107 by doping the second region 107 with an n-type impurity such as phosphorous, although other n-type dopants such as arsenic, antimony, nitrogen, or the like could alternatively be used. This will form an n-well region 104 in the second region 107 of the substrate 101, while the first region 105 and the third region 109 retain a p-type conductivity.

Figure 2:
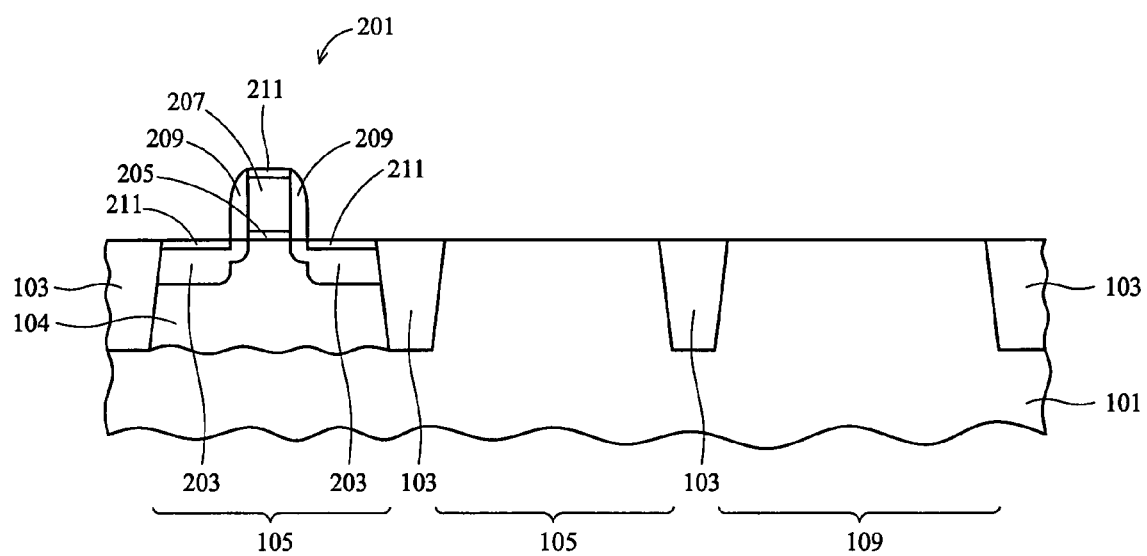
FIG. 2 is a cross-sectional view of the structure of FIG. 1 with a PMOS transistor formed in one of the regions in the substrate in accordance with an embodiment of the present invention.

FIG. 2 illustrates the formation of a PMOS transistor 201 in the second region 107 of the substrate 101 in accordance with an embodiment of the present invention. This PMOS transistor 201 has source/drain regions 203, a gate dielectric 205, a gate electrode 207, spacers 209, and, optionally, silicided contacts 211.

The gate dielectric 205 and gate electrode 207 are formed and patterned in the second region 107 of the substrate 101 by any suitable process known in the art. The gate dielectric 205 is preferably a high-K dielectric material, such as silicon oxide, silicon oxynitride, silicon nitride, an oxide, a nitrogen-containing oxide, a combination thereof, or the like. Preferably, the gate dielectric 205 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate dielectric 205 comprises an oxide layer, the gate dielectric 205 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the gate dielectric 205 is between about 8 Å and about 50 Å in thickness, but is preferably about 16 Å in thickness.

The gate electrode 207 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In the preferred embodiment in which the gate electrode 207 is poly-silicon, the gate electrode 207 is formed by depositing doped or undoped poly-silicon by low-pressure chemical vapor deposition (LPCVD) to a thickness in the range of about 400 Å to about 2,500 Å, but more preferably about 1,500 Å.

The spacers 209 are formed on the sidewalls of the gate dielectric 205 and the gate electrode 207. The spacers 209 are typically formed by blanket depositing a spacer layer (not shown) on the previously formed structure. The spacer layer preferably comprises SiN, oxynitride, SiC, SiON, oxide, and the like and is preferably formed by commonly used methods such as chemical vapor deposition (CVD), plasma enhanced CVD, sputter, and other methods known in the art. The spacers 209 are then patterned, preferably by anisotropically etching to remove the spacer layer from the horizontal surfaces of the structure.

Source/drain regions 203 are formed in the first region 105 by implanting appropriate p-type dopants such as boron, gallium, indium, or the like into the n-well region 104. These source/drain regions 203 are implanted using the gate electrode 207 and the gate spacers 209 as masks. It should be noted that one of ordinary skill in the art will realize that many other processes, steps, or the like may be used to form these source/drain regions 203. For example, one of ordinary skill in the art will realize that a plurality of implants may be performed using various combinations of spacers and liners to form source/drain region having a specific shape or characteristic suitable for a particular purpose. Any of these processes may be used to form the source/drain regions 203, and the above description is not meant to limit the present invention to the steps presented above.

Optionally, a salicide process can be used to form silicide contacts 211 for the source/drain regions 203 and the gate electrode 207. The silicide contacts 211 preferably comprise nickel. However, other commonly used metals, such as titanium, cobalt, palladium, platinum, erbium, and the like, can also be used. As is known in the art, the silicidation is preferably performed by blanket deposition of an appropriate metal layer, followed by an annealing step in which the metal reacts with the underlying exposed silicon. Un-reacted metal is then removed, preferably with a selective etch process. The thickness of the silicide contacts 211 is preferably between about 5 nm and about 50 nm.

Figure 3:
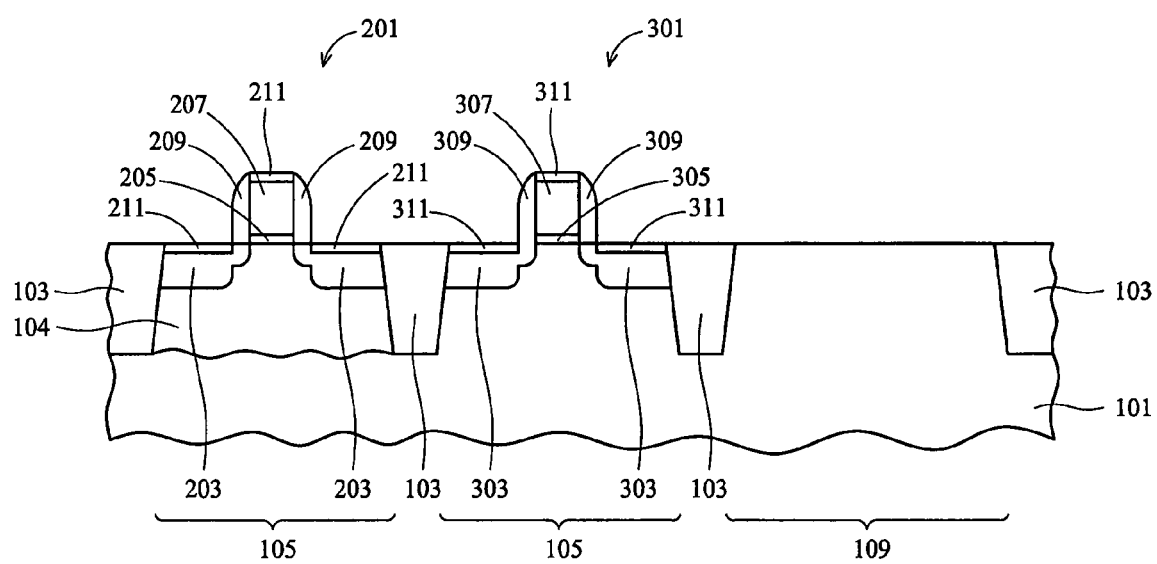
FIG. 3 is a cross-sectional view of the structure of FIG. 2 with an NMOS transistor formed in a second region of the substrate in accordance with an embodiment of the present invention.

FIG. 3 illustrates the formation of an NMOS transistor 301 in the first region 105 of the substrate 101, in accordance with an embodiment of the present invention. Similar to the PMOS transistor 201, the NMOS transistor 301 has source/drain regions 303, a gate dielectric 305, a gate electrode 307, spacers 309, and silicided contacts 311. The gate dielectric 305, the gate electrode 307, the spacers 309, and the silicided contacts 311 may be formed as discussed above with reference to the gate dielectric 205, the gate electrode 207, the spacers 209, and the silicided contacts 211, respectively, of FIG. 2.

Source/drain regions 303 are formed in the first region 105 by implanting n-type impurities such as nitrogen, phosphorous, arsenic, or the like into the first region 105 of the substrate 101. These source/drain regions 303 are preferably implanted using some combination of the gate electrode 307 and the gate spacers 309 as masks. As discussed above with reference to the source/drain 203, one of ordinary skill in the art will realize that many other processes, steps, or the like may be used to form these source/drain regions 303. For example, one of ordinary skill in the art will realize that a plurality of implants may be performed using various combinations of spacers and liners to form source/drain region having a specific shape or characteristic suitable for a particular purpose. Any of these processes may be used to form the source/drain regions 303, and the above description is not meant to limit the present invention to the steps presented above.

Figure 4:
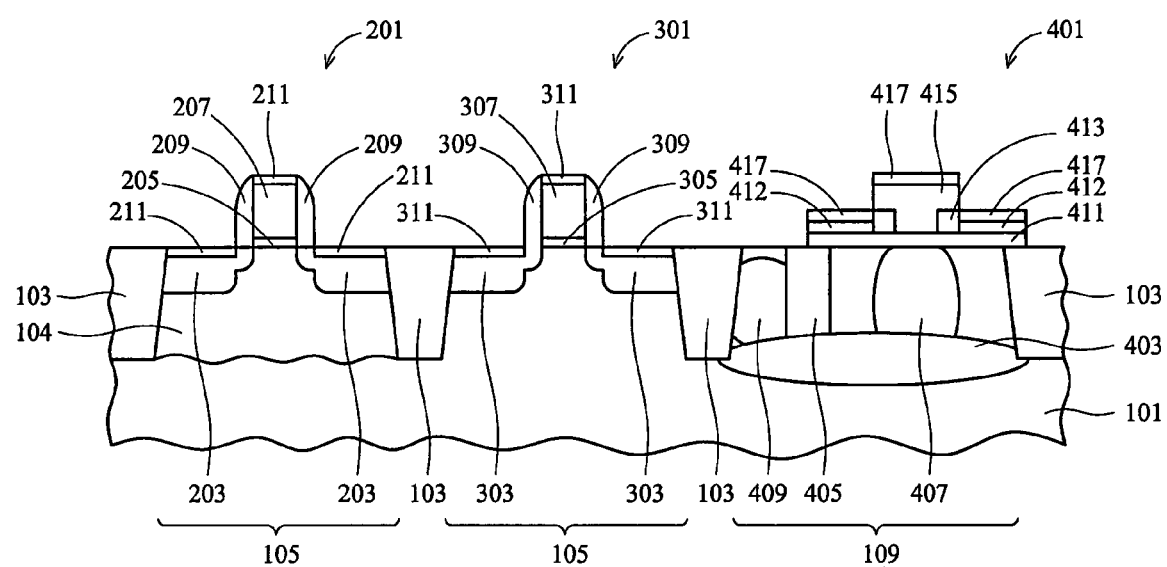
FIG. 4 is a cross-sectional view of the structure of FIG. 3 with a BJT formed in the third region of the substrate in accordance with an embodiment of the present invention.

FIG. 4 shows the formation of a BJT 401 in the third region 109 of the substrate 101 in accordance with an embodiment of the present invention. To form the BJT 401 an N+ buried layer 403 may be formed by implanting an n-type dopant such as phosphorous into the substrate 101. However, other n-type dopants such as arsenic, nitrogen, antimony, or the like, and other methods of implantation could alternatively be used. The N+ buried layer 403 may be formed at a depth of between about 0.5 μm and about 1 μm away from the upper surface of the substrate 101, and has a thickness between about 0.6 μm and about 0.8 μm, with a preferred depth of about 0.8 μm and a preferred thickness of about 0.6 μm.

Once the N+ buried layer 403 has been formed, an isolation structure 405 may be formed over a portion of the N+ buried layer 403. This isolation structure 405 is preferably formed by etching the substrate 101 to form a trench and filling the trench with a dielectric material as is known in the art. Preferably, the isolation structure 405 is filled with a dielectric material such as an oxide material, a high-density plasma (HDP) oxide, or the like, formed by conventional methods known in the art. However, other types of isolation structures could alternatively be used to isolate two regions in the third region 109 of the substrate 101.

Once the isolation structure 405 has been formed, a collector 407 and a collector sinker 409 are formed. The collector 407 may be formed between the upper surface of the substrate 101 and the N+ buried layer 403. The collector 407 is preferably formed between, but not substantially in contact with, the isolation structure 405 and the isolation region 103 separating the BJT 401 from the other devices on the substrate 101. The collector 407 may be formed by using ion implantation to implant an n-type dopant such as phosphorous into the substrate 101. However, other n-type dopants, such as arsenic, nitrogen, antimony, or the like, and other implantation methods could alternatively be used.

A collector sinker 409 may also be formed between the N+ buried layer 403 and the upper surface of the substrate 101. The collector sinker 409 is preferably located on the opposite side of the isolation structure 405 than the collector 407. The collector sinker 409 may be formed using ion implantation to implant an n-type dopant such as phosphorous into the substrate 101. However, other n-type dopants, such as arsenic, nitrogen, or antimony, and other methods of implantation could alternatively be used.

A base 411 is preferably formed on a portion of the upper surface of the substrate 101 in the third region 109. The base 411 preferably comprises polysilicon doped with a p-type dopant such as boron. The base 411 is preferably formed by a low temperature epitaxial (LTE) technique. The base 411 has a thickness of between about 10 nm and about 50 nm, with a preferred thickness of 20 nm. Other formation methods, such as epitaxial growth, and other p-type dopants, such as aluminum or gallium, could alternatively be used to form the base 411.

Optionally, the base 411 could be formed of silicon-germanium (SiGe) in order to form an HBT, instead of a BJT, although other materials such as aluminum gallium arsenide could alternatively be used.

A base connection 412 may be formed over the base 411. The base connection 412 is preferably polysilicon. In an embodiment where the base 411 is polysilicon, the base connection 412 is formed at the same time and in the same method as the base 411. If the base 411 is SiGe, the base connection 412 may be formed in a separate step by epitaxial growth. In an embodiment where the base 411 is doped with boron, the base connection 412 is also doped with a p-type dopant such as boron. The base connection 412 preferably has a thickness of between about 40 nm and about 80 nm, with a preferred thickness of about 60 nm.

The base connection 412 may be etched to substantially expose a portion of the base 411, and a dielectric layer 413 can be formed above the base 411. The dielectric layer 413 is preferably an oxide layer. In an embodiment the dielectric layer 413 is formed, for example, by thermal growth, at a temperature of about 600° C. to about 900° C., or by chemical vapor deposition (CVD) techniques using tetra-ethyl-orthosilicate (TEOS) and oxygen as a precursor. Other processes and materials known in the art may be used. Other materials, such as silicon oxide, nitrogen-containing oxide, aluminum oxide, lanthanum oxide, hafnium oxide, zirconium oxide, hafnium oxynitride, combinations thereof, or the like, may be used. Preferably, the dielectric layer 413 has a thickness of between about 100 nm and about 200 nm, with a preferred thickness of about 150 nm.

The dielectric layer 413 can then be etched, substantially exposing a portion of the base 411, and filled to form an emitter 415 that fills the etched area and also overlies the dielectric layer 413. The emitter 415 is preferably formed of polysilicon doped with an n-type dopant such as phosphorous and may be formed through a CVD process. However, other materials and processes may alternatively be used to form the emitter 415.

Optionally, a salicide process can be used to form silicide contacts 417 for the emitter 415 and the base connections 412. The silicide contacts 417 preferably comprise nickel. However, other commonly used metals, such as titanium, cobalt, palladium, platinum, erbium, and the like, can also be used. As is known in the art, the silicidation is preferably performed by blanket deposition of an appropriate metal layer, followed by an annealing step in which the metal reacts with the underlying exposed silicon. Un-reacted metal is then removed, preferably with a selective etch process. The thickness of the silicide contacts 417 is preferably between about 5 nm and about 50 nm.

In an alternative configuration, the BJT 401 could be a PNP transistor instead of the NPN transistor described above. In this embodiment the third region 109 of the substrate 101 is initially doped with an n-type dopant such as phosphorous. Accordingly, the emitter 415 and collector 407 would be formed with a p-type material such as silicon doped with boron and the base 411 would be formed with an n-type dopant such as phosphorous or arsenic.

Figure 5:
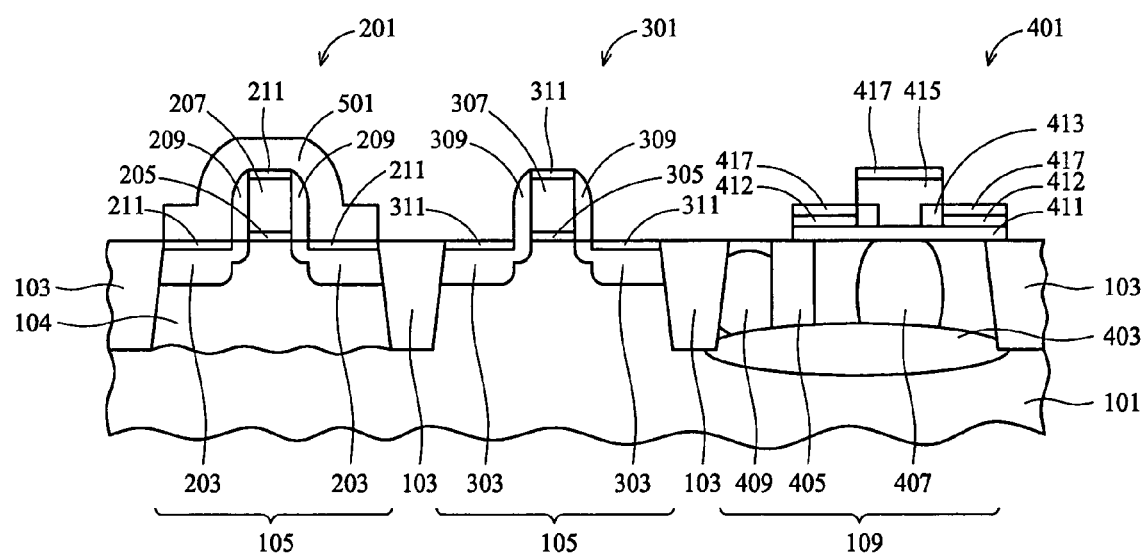
FIG. 5 is a cross-sectional view of the structure of FIG. 4 with a tensile CESL formed over the NMOS transistor in accordance with an embodiment of the present invention.

FIG. 5 illustrates the formation of a first contact etch stop layer 501 (CESL-1) over the NMOS transistor 301 in accordance with an embodiment of the present invention. In an embodiment, the CESL-1 501 is formed of silicon nitride using plasma enhanced chemical vapor deposition (PECVD). Other materials such as nitride, oxynitride, combinations thereof, or the like, and alternative techniques of forming the CESL-1 501, such as plasma enhanced CVD, could alternatively be used. The CESL-1 501 preferably has a thickness of between about 20 nm and about 200 nm, with a preferred thickness of about 80 nm. The CESL-1 501 preferably imparts a tensile stress between about 0.1 and about 1.9 GPa. This tensile stress creates a tensile strain in the channel of the NMOS transistor 301 in the uniaxial direction parallel to the source/drain direction.

Figure 6:
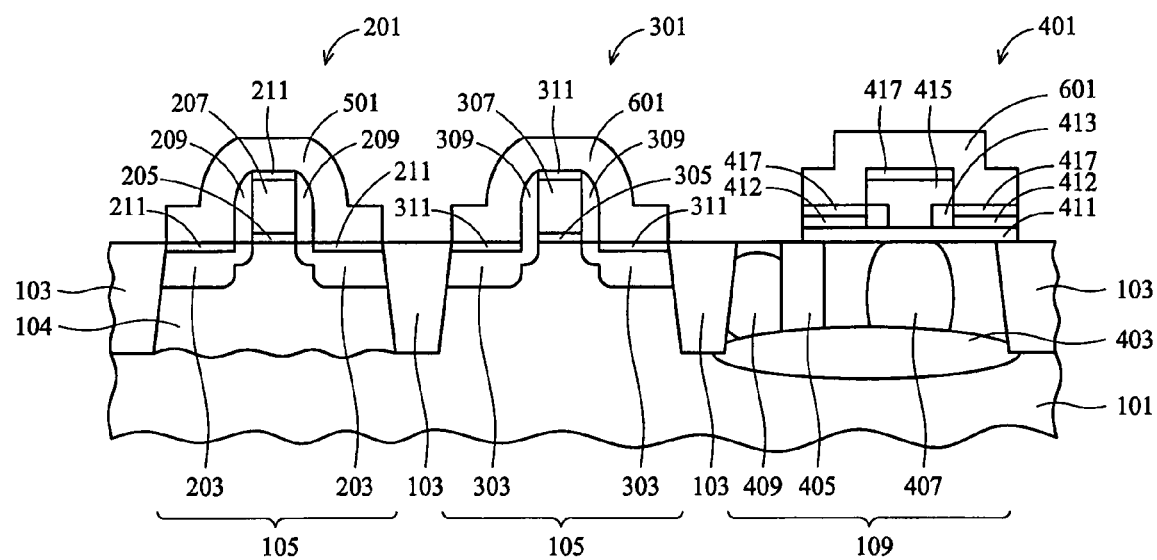
FIG. 6 is a cross-sectional view of the structure of FIG. 5 with a compressive CESL formed over the PMOS transistor and the BJT, but not over the NMOS transistor, in accordance with an embodiment of the present invention.

FIG. 6 illustrates the formation of a second contact etch stop layer 601 (CESL-2) over the PMOS transistor 201 in the second region 107 of the substrate 101 and over the BJT 401 in the third region 109 of the substrate 101. In an embodiment, the CESL-2 601 may be formed of silicon nitride by PECVD. However, other materials such as nitride, oxynitride, combinations thereof, or the like, and other methods of formation, such as LPCVD, could alternatively be used. Preferably, the CESL-2 601 has a thickness of between about 20 nm and about 200 nm, with a preferred thickness of about 80 nm. The CESL-2 601 preferably imparts a compressive stress between about 0.1 and about 1.9 GPa. This compressive stress creates a compressive strain in the channel region of the PMOS transistor 201 and the base of the BJT 401.

Figure 7:
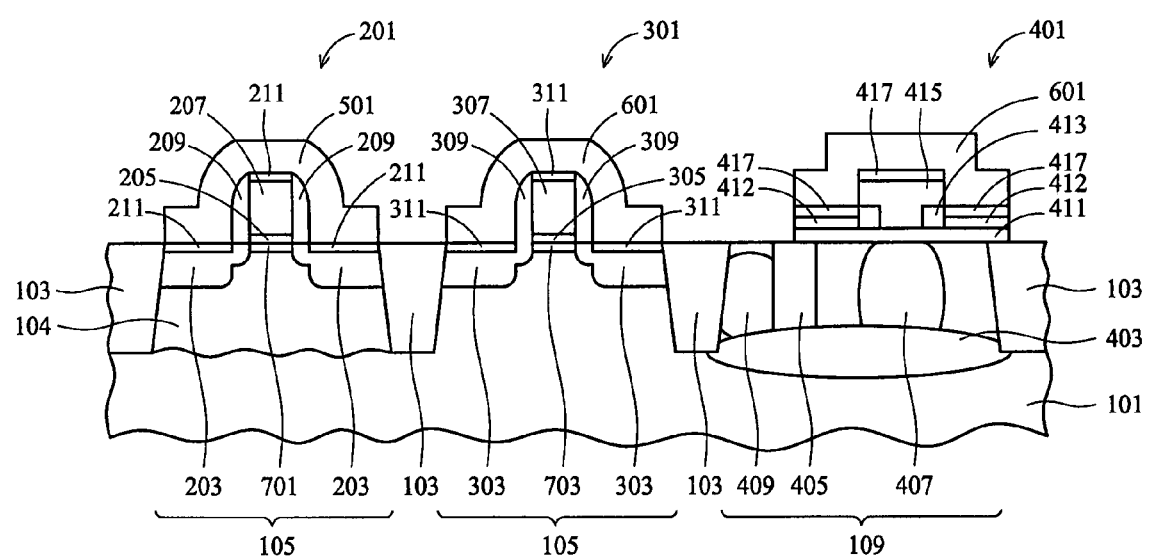
FIG. 7 is a cross-sectional view of an embodiment of the present invention with an additional strained channel region being present in the NMOS transistor and the PMOS transistor, and the BJT comprising a strained base.

FIG. 7 illustrates another embodiment where the PMOS transistor 201 and the NMOS transistor 301 each have a lattice-mismatched area between the substrate 101 and the devices, and the BJT 401 has a lattice-mismatched base 411. In this embodiment a recessed region (not shown) is formed in the first region 105 of the substrate 101 prior to the formation of the gate dielectric 305 for the NMOS transistor 301. In the preferred embodiment, where the substrate 101 is a silicon substrate, plasma etching employing fluorine chemistry may be used to form the recessed region.

Selective epitaxy may be used to form a channel region 703 within the recessed region. To be effective in enhancing the NMOS transistor 301, the material used in the channel region 703 should have a lattice constant less than the substrate 101 upon which it sits in order to form a biaxial tensile strain in the channel region 703. Accordingly, in an embodiment where the substrate 101 is silicon-germanium, the channel region 703 is preferably silicon. The channel region 703 preferably has a thickness of between about 2 nm and about 50 nm, with a preferred thickness of 10 nm. The remainder of the NMOS transistor 301 can be formed as described above with respect to FIG. 3. The mismatched lattices of the substrate 101 and the channel region 701 create a biaxial tensile strain in the channel region 701 that will further enhance the performance of the NMOS transistor 301.

In the formation of the PMOS transistor 201, a recessed region (not shown) may be formed within the second region 107 of the substrate 101 prior to the formation of the gate dielectric 205. In the preferred embodiment, where the substrate 101 is a silicon substrate, plasma etching employing fluorine chemistry may be used to form the recess.

Selective epitaxy may be used to form a channel region 701 within the recessed region. To enhance the PMOS transistor 201, a material with a larger lattice constant should be used for the channel region 701. Accordingly, in an embodiment of the present invention in which the substrate 101 is silicon, the lattice-mismatched channel region 701 is preferably silicon germanium. Other methods of formation could alternatively be used. The channel region 703 has a thickness between about 2 nm and about 50 nm, with a preferred thickness of about 15 nm. The remainder of the PMOS transistor 201 may be formed as described above with respect to FIG. 2. The mismatched lattices of the substrate 101 and the channel region 701 create a compressive strain in the channel region 701 that will further enhance the performance of the PMOS transistor 201.

In the formation of the BJT 401, the base 411 is preferably a material with a larger lattice constant than the underlying substrate 101. Accordingly, in the embodiment where the substrate 101 is silicon, the base 411 is preferably silicon germanium or silicon germanium carbon. The base 411 may be formed using an epitaxial growth process, and may be grown to the same dimensions as discussed above with reference to FIG. 4. The mismatched lattices of the substrate 101, the base 411, and the emitter 415 create a compressive strain in the base region 411 that will further enhance the performance of the BJT 401.

As one of ordinary skill in the art will appreciate, in the present invention the combination of CESL-1 501 and CESL-2 601 combines tensile stress on the NMOS transistor 301 and compressive stress on the PMOS transistor 201 and the bipolar transistor 401. This combination of stresses on different areas of the BiCMOS results in an enhancement of each device's drive current, instead of an enhancement of one device's performance at the expense of another device's performance.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor device comprising:
   a substrate with a first region, a second region, and a third region, the substrate having a first lattice constant;
   a first semiconductor device located in the first region;
   a second semiconductor device located in the second region, the second semiconductor device being different from the first semiconductor device;
   a first bipolar device located in the third region;
   a first dielectric film overlying the first region, the first dielectric film having a tensile stress; and
   a second dielectric film overlying the second region and the third region, the second dielectric film having a compressive stress.

2. The semiconductor device of claim 1, wherein the first semiconductor device is an NMOS transistor.

3. The semiconductor device of claim 2, wherein the NMOS transistor further comprises a channel region having a second lattice constant that is less than the first lattice constant.

4. The semiconductor device of claim 1, wherein the second semiconductor device is a PMOS transistor.

5. The semiconductor device of claim 4, wherein the PMOS transistor further comprises a channel region having a third lattice constant that is larger than the first lattice constant.

6. The semiconductor device of claim 1, wherein the first bipolar device is a bipolar transistor.

7. The semiconductor device of claim 6, wherein the bipolar transistor comprises an emitter, a base, and a collector, the base region comprising Si, SiGe, or SiGeC.

8. The semiconductor device of claim 1, wherein the compressive stress is between about 0.1 GPa and about 1.9 GPa.

9. The semiconductor device of claim 1, wherein the tensile stress is between about 0.1 GPa and about 1.9 GPa.

10. A BiCMOS device comprising:
a substrate with a first region, a second region, and a third region, the substrate having a first lattice constant;
a first MOS transistor located in the first region;
a second MOS transistor located in the second region;
a first bipolar transistor located in the third region;
a first dielectric film over the first MOS transistor, the first dielectric film having a tensile stress; and
a second dielectric film over the second MOS transistor and the first bipolar transistor, the second dielectric film having a compressive stress.

11. The BiCMOS device in claim 10, wherein the first bipolar transistor comprises:
an emitter;
a base comprising Si, SiGe, or SiGeC; and
a collector.

12. The BiCMOS device of claim 10, wherein the first MOS transistor is an NMOS transistor, and the second MOS transistor is a PMOS transistor.

13. The BiCMOS device of claim 12, wherein the PMOS transistor further comprises a channel region having a second lattice constant that is larger than the first lattice constant.

14. The BiCMOS device of claim 12, wherein the NMOS transistor further comprises a channel region having a third lattice constant that is less than the first lattice constant.

15. The BiCMOS device of claim 10, wherein the compressive stress is between about 0.1 GPa and about 1.9 GPa.

16. The BiCMOS device of claim 10, wherein the tensile stress is between about 0.1 GPa and about 1.9 GPa.

17. A BiCMOS device comprising:
a substrate comprising a first region, a second region, and a third region, the substrate having a first lattice constant;
an NMOS transistor in the first region, the NMOS transistor comprising a channel region with a second lattice constant, the second lattice constant being smaller than the first lattice constant;
a PMOS transistor in the second region, the PMOS transistor comprising a channel region with a third lattice constant, the third lattice constant being larger than the first lattice constant;
a bipolar transistor in the third region, the bipolar transistor comprising a base having the third lattice constant;
a first dielectric film over the NMOS transistor, the first dielectric film having a tensile stress; and
a second dielectric film over the PMOS transistor and the bipolar transistor, the second dielectric film having a compressive stress.

18. The BiCMOS device of claim 17, wherein the bipolar transistor comprises:
an emitter;
a base comprising Si, SiGe, or SiGeC; and
a collector.

19. The BiCMOS device of claim 17, wherein the compressive stress is between about 0.1 and about 1.9 GPa.

20. The BiCMOS device of claim 17, wherein the tensile stress is between about 0.1 and about 1.9 GPa.

* * * * *

UNITED STATES PATENT AND TRADEMARK OFFICE
CERTIFICATE OF CORRECTION

| | |
|---|---|
| PATENT NO. | : 7,466,008 B2 |
| APPLICATION NO. | : 11/717484 |
| DATED | : December 16, 2008 |
| INVENTOR(S) | : Ko et al. |

It is certified that error appears in the above-identified patent and that said Letters Patent is hereby corrected as shown below:

In the drawings, Figs. 1-7, delete the leftmost "105" and insert --107--.
In the drawings, Fig. 5, delete layer 501 from over PMOS transistor 201 and insert it over NMOS transistor 301.
In the drawings, Fig. 6, delete the leftmost "501" and insert --601--.
In the drawings, Fig. 6, delete "601" in the center of the figure and insert --501--.
In the drawings, Fig. 7, delete the leftmost "501" and insert --601--.
In the drawings, Fig. 7, delete "601" in the center of the figure and insert --501--.

Signed and Sealed this

Tenth Day of November, 2009

David J. Kappos
*Director of the United States Patent and Trademark Office*